United States Patent [19]

Bhattacharya et al.

[11] Patent Number: 5,730,852
[45] Date of Patent: Mar. 24, 1998

[54] PREPARATION OF CUXINYGAZSEN (X=0-2, Y=0-2, Z=0-2, N=0-3) PRECURSOR FILMS BY ELECTRODEPOSITION FOR FABRICATING HIGH EFFICIENCY SOLAR CELLS

[75] Inventors: Raghu N. Bhattacharya, Littleton; Miguel A. Contreras, Golden; James Keane, Lakewood; Andrew L. Tennant; John R. Tuttle, both of Denver; Kannan Ramanathan, Lakewood; Rommel Noufi, Golden, all of Colo.

[73] Assignee: Davis, Joseph & Negley, Austin, Tex.

[21] Appl. No.: 571,150

[22] Filed: Dec. 12, 1995

Related U.S. Application Data

[60] Provisional application No. 60/004,269, Sep. 25, 1995.
[51] Int. Cl.$^6$ .......................... H01L 31/18; C23C 28/02
[52] U.S. Cl. .......................... 205/192; 205/103; 205/104; 205/239; 205/915; 437/5; 136/264; 136/265
[58] Field of Search .......................... 205/103–104, 205/192, 915, 239; 437/5, 108, 111; 427/76; 136/260, 264, 265; 257/184; 204/DIG. 8

[56] References Cited

U.S. PATENT DOCUMENTS

| | | | |
|---|---|---|---|
| 3,530,053 | 9/1970 | Scott et al. | 430/130 |
| 3,978,510 | 8/1976 | Kasper et al. | 257/184 |
| 4,256,544 | 3/1981 | Kazacos et al. | 136/260 |
| 4,335,266 | 6/1982 | Mickelsen et al. | 136/260 |
| 4,376,016 | 3/1983 | Fawcett et al. | 205/229 |
| 4,392,451 | 7/1983 | Mickelsen et al. | 118/690 |
| 4,581,108 | 4/1986 | Kapur et al. | 205/170 |
| 4,611,091 | 9/1986 | Choudary et al. | 136/260 |
| 4,798,660 | 1/1989 | Ermer et al. | 204/192.17 |
| 4,915,745 | 4/1990 | Pollock et al. | 136/265 |
| 5,045,409 | 9/1991 | Eberspacher et al. | 428/620 |
| 5,112,410 | 5/1992 | Chen | 136/260 |
| 5,356,839 | 10/1994 | Tuttle et al. | 437/225 |
| 5,436,204 | 7/1995 | Albin et al. | 437/225 |
| 5,441,897 | 8/1995 | Noufi et al. | 437/5 |

OTHER PUBLICATIONS

C.D. Lokhande, *J. Electrochem. Soc.*, vol. 134, No. 7, Jul. 1987, pp. 1727–1729.

*Solar Cells*, 16(1986) 237–243—"Electrodeposition of CuInX (X=Se, Te) Thin Films"—R.N. Bhattacharya et al.

*Solar Cells*, 21(1987) 65–72—"Low Cost Methods for the Production of Semiconductor Films for CuInSe$_2$/CdS Solar Cells"—Kapur et al.

*Solar Energy Materials*, 16(1987) 447–485—"Electrochemical Synthesis of Photoactive In$_2$Se$_3$ Thin Films"—J. Herrero et al.

"A 17.1%—Efficient CU(IN,GA)SE$_2$–Based Thin–Film Solar Cell"—J.R. Tuttle et al.—*Progress in Photovoltaics*—Jul.–Aug. 1995.

*Solar Cells*, 24 (1988) 91–102, "Device Quality Thin Films of CuInSe$_2$ by a One–Step Electrodeposition Process"—F.J. Pern et al.

*J. Electrochem. Soc.*: Electrochemical Science and Technology—Oct. 1983, 2040–42—"Solution Growth and Electrodeposited CuInSe$_2$ Thin Films", R.N. Bhattacharya.

(List continued on next page.)

*Primary Examiner*—Aaron Weisstuch
*Attorney, Agent, or Firm*—Oppenheimer Poms Smith

[57] ABSTRACT

High quality thin films of copper-indium-gallium-diselenide useful in the production of solar cells are prepared by electrodepositing at least one of the constituent metals onto a glass/Mo substrate, followed by physical vapor deposition of copper and selenium or indium and selenium to adjust the final stoichiometry of the thin film to approximately Cu(In, Ga)Se$_2$. Using an AC voltage of 1–100 KHz in combination with a DC voltage for electrodeposition improves the morphology and growth rate of the deposited thin film. An electrodeposition solution comprising at least in part an organic solvent may be used in conjunction with an increased cathodic potential to increase the gallium content of the electrodeposited thin film.

20 Claims, 2 Drawing Sheets

OTHER PUBLICATIONS

*Solar Energy Materials* 25 (1991) 31-45—"Optical Properties of Electrochemically Deposited $CuInSe_2$ Thin Films"—C. Guillen et al.

*Advanced Materials* 1994 vol. 6 No. 5, 379-81—"Solar Cells With Improved Efficiency Based on Electrodeposited Copper Indium Diselenide Thin Films", Guillmoles et al.

*Jpn. J. Appl. Phys.* vol. 32 (1993) pp. 1562-1567 Part 1, No. 4, Apr. 1993—"Preparation and Characterization of Electrodeposited $CuInSe_2$ Thin Fims"—Sudo et al.

*Advanced Materials* 1994 vol. 6, No. 5—pp. 376-379—"Recrystallization of Electrodeposited Copper Indium Diselenide Thin Films in an Atmosphere of Elemental Selenium"—Guillemoles et al.

PREPARATION OF CUXINYGAZSEN (X=0-2, Y=0-2, Z=0-2, N=0-3) PRECURSOR FILMS BY ELECTRODEPOSITION FOR FABRICATING HIGH EFFICIENCY SOLAR CELLS

The government has rights in this invention pursuant to National Renewable Energy Laboratory (NREL) contract No. 1326.

RELATED APPLICATIONS

This application is a continuation-in-part of provisional application Ser. No. 60/004269, filed Sep. 25, 1995.

BACKGROUND OF THE INVENTION

1. Field of the Invention

The field of the present invention relates to the preparation of thin film semiconductor devices. More particularly, the present invention relates to electrodeposition of copper-indium- gallium-selenide films for solar cells.

2. Description of the Related Art

Chalcopyrite ternary thin films of copper-indium-diselenide ($CuInSe_2$) and copper-indium- gallium-diselenide ($CuIn_{1-x}Ga_xSe_2$), both of which are generically referred to as $Cu(In,Ga)Se_2$, CIGS, or simply CIS, have become the subject of considerable interest and study for semiconductor devices in recent years. Sulphur can also be, and sometimes is, substituted for selenium, so the compound is sometimes also referred to even more generically as $Cu(In,Ga)(Se,S)_2$ so as to encompass all of these possible combinations. These devices are also referred to as I-III-$VI_2$ devices according to their constituent elemental groups.

These devices are of particular interest for photovoltaic device or solar cell absorber applications. For photovoltaic applications, the p-type CIGS layer is combined with an n-type CdS layer to form a p-n heterojunction CdS/CIGS device. The direct energy gap of CIGS results in a large optical absorption coefficient, which in turn permits the use of thin layers on the order of 1–2 μm. An additional advantage of CIGS devices is their long-term stability.

Various methods have been reported for fabricating CIGS thin films. Some of the earliest techniques involved heating copper and indium on a substrate in the presence of a selenium-containing gas, including $H_2Se$. The heating of copper and indium films in the presence of a selenium-containing gas is known as selenization. One drawback to selenizing with $H_2Se$ is that $H_2Se$ gas is highly toxic, thus presenting serious hazards to humans in large scale production environments.

In U.S. Pat. No. 5,045,409, Eberspacher et al. disclose depositing copper and indium films by magnetron sputtering, and depositing a selenium film by thermal evaporation, followed by heating in the presence of various gases. Other methods for producing CIS films have included Molecular Beam Epitaxy, electrodeposition either in single or multiple steps, and vapor deposition of single crystal and polycrystalline films.

Although vapor deposition techniques have been used to yield solar cells with efficiencies as high as seventeen percent (17%), vapor deposition is costly. Accordingly, solar cells made by vapor deposition have generally been limited to devices for laboratory experimentation, and are not suitable for large scale production. On the other hand, thin film solar cells made by electrodeposition techniques are generally much less expensive. However, solar cells produced by electrodeposition generally suffer from low efficiencies. For example, in *Solar Cells with Improved Efficiency Based on Electrodeposited Copper Indium Diselenide Thin Films*, ADVANCED MATERIALS, Vol. 6 No. 5 pp 379–381 (1994), Guillemoles et al. report solar cells prepared by electrodeposition with efficiencies on the order of 5.6%.

SUMMARY OF THE INVENTION

Accordingly, it is a general object of this invention to provide an improved process for fabricating high quality thin film $Cu(In,Ga)Se_2$ solar cells.

It is also an object of this invention to provide low cost, high quality thin film solar cells having high conversion efficiencies.

It is a further object of this invention to provide a process for producing Cu—In, Cu—Se, Cu—In—Se, and Cu—In—Ga—Se thin films that have applications in solar and non-solar cells.

It is a still further object of this invention to provide a process for electrodepositing a gallium-containing thin-film solar cell precursor.

To achieve the foregoing and other objects and advantages in accordance with the purpose of the present invention, as embodied and broadly described herein, the process of this invention includes electrodepositing a layer of $Cu_xIn_yGa_zSe_n$ (x=0–2, y=0–2, z=0–2, n=0–3), preferably using direct current in combination with alternating current, followed by vapor depositing additional copper and selenium or indium and selenium to adjust the final composition very close to stoichiometric $Cu(In,Ga)Se_2$. This unique two-step film deposition process allows photovoltaic precursor films to be deposited by inexpensive electrodeposition, and then adjusted using the more expensive but more precise technique of physical vapor deposition to bring the final film into the desired stoichiometric range. Solar cells may then be completed as for example by chemical bath deposition (CBD) of CdS followed by sputtering of ZnO, and addition of bi-layer metal contacts as well as optional anti-reflective coating. A solar cell made according to the present process has exhibited a device efficiency of 9.44%.

Additional objects, advantages, and novel features of the present invention will be set forth in part in the description that follows, and in part will become apparent to those skilled in the art upon examination of the following description and drawings.

DETAILED DESCRIPTION OF THE PREFERRED EMBODIMENTS

The present invention includes an essentially two-step process for fabricating high quality, low cost thin film CIGS semiconductor devices that exhibit photovoltaic characteristics and are especially adaptable for solar cell applications. In the first step, a photovoltaic precursor film of $Cu_xIn_yGa_zSe_n$ (x=0–2, y=0–2, z=0–2, n=0–3) is electrodeposited on a substrate such as glass coated with molybdenum. This first step may include a unique process and electrodeposition bath for electrodepositing gallium concurrently with other elements, as well as the unique use of an alternating current in conjunction with a direct current.

The second step is physical vapor deposition of either Cu+Se or In+Se, either alone or in combination with Ga. In this second step the composition of the overall film is carefully controlled so that the resulting thin film is very close to stoichiometric $Cu(In,Ga)Se_2$. Both of these steps may be performed on substrates having large surface areas. Accordingly, the process of the present invention allows large area, high efficiency solar cells to be economically produced.

Figure 1:
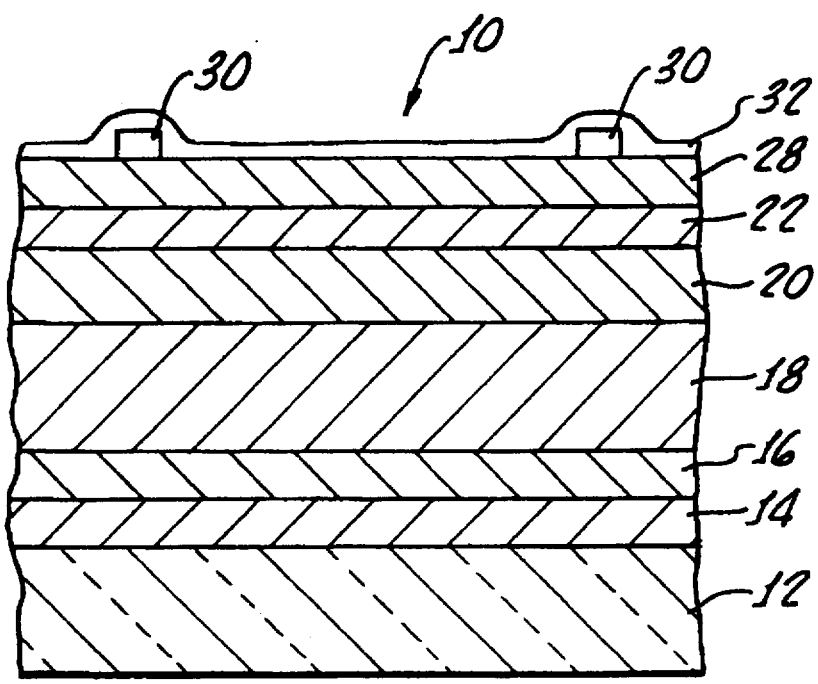
FIG. 1 is a cross sectional view of a CIGS photovoltaic device prepared according to the present invention.

Referring now to FIG. 1, CdS/CIGS photovoltaic device 10 includes a substrate 12 which may be, for example, soda-lime silica glass or amorphous 7059 glass. Substrate 12 further includes a back contact layer 14 of molybdenum, about 1-2 μm thick. The molybdenum may be deposited using DC sputtering from a rotating cylindrical magnetron target (CMAG). To improve adhesion between the Mo layer 14 and the precursor film to be deposited, an additional adhesion layer 16 of copper may also be deposited as by electrodeposition. After Mo layer 14 and optional copper adhesion layer 16 have been deposited, the substrate should be degreased as for example with propanol and dried in flowing nitrogen gas.

A photovoltaic precursor film 18 is then deposited by electrodeposition. The precursor film contains one or more of the elements copper, indium, gallium, and selenium. Electrodeposition is generally a less expensive method of depositing these metals than vapor deposition. However, it is not possible to control the ratios of metals deposited during electrodeposition as precisely as desired. Consequently, prior CIGS layers deposited entirely by electrodeposition produced low conversion efficiencies. In the present invention, the electrodeposition step is integrated with the vapor deposition step that follows. This allows precursor films to be deposited in bulk using an economical electrodeposition step, followed by a vapor deposition step to carefully control the final ratios. This results in economical production yet high efficiencies of the resulting cell. The composition of precursor film 18 is generally denoted as $Cu_xIn_yGa_zSe_n$ (x=0–2, y=0–2, z=0–2, n=0–3). The metal precursor film 18 should be deposited to about 1–3 μm thick, with thickness being controlled by coulometric measurements.

It has been found that electrodepositing the films using an AC voltage in addition to a DC voltage produces improved results. An AC voltage improves the morphology of the film. It is also believed that the AC voltage improves nucleation (growth) of the thin film by allowing additional nucleation centers to be created. For an entirely aqueous plating solution, the applicable DC voltage range is approximately 1–5 VDC, with a preferred voltage of approximately 2 VDC. Improved results may be obtained by superimposing an AC voltage of 0.2–5.0 VAC at 1–100 Khz, with preferred values of approximately 0.3–1.0 VAC at 10–30 KHz. A value of approximately 0.45 VAC at approximately 18.1 KHz was found to yield good results. The plating solution is adjusted to have a pH of approximately 1.0 to 4.0, and more preferably to about 1.4 to 2.4. The plating solution should preferably be at about 10° C. to 80° C., and more preferably at about 24° C. Adding a supporting electrolyte to the plating bath can additionally increase the conductivity of the plating solution, allowing for a further increase in the electrodeposition rate. Salts such as NaCl, LiCl, or $Na_2SO_4$ have been found to be suitable supporting electrolytes for use with certain embodiments of the present invention.

In completely aqueous solutions, electrolysis of water molecules begins to occur to an undesirable extent at approximately 2–3 volts. The resulting $O^{2-}$ and $OH^-$ ions combine with deposition metal ions or deposited metal to form unwanted metal oxides and hydroxides on the precursor film 18. To overcome this disadvantage, the water in the plating solution may be either partially or completely replaced by one or more organic solvents such as dimethyl sulfoxide (DMSO). Increasing the organic solvent content of the electrodeposition solution allows the cathodic potential to be increased without unacceptable increases in metal oxide and hydroxide formation rates. The increased cathodic potential increases the deposition rate of the precursor films. An additional advantage is that increasing the cathodic potential increases the deposition rate of gallium relative to the deposition rates of other deposited metals. Therefore, using a solution containing one or more organic solvents allows the cathodic potential to be selected from a wider range so as to achieve a more desired stoichiometry of the as-deposited precursor film 18. When an organic solvent is used, the preferred cathodic potential is approximately 3–10 VDC and 0.2–5.0 VAC at approximately 1–100 KHz. Values of approximately 5 VDC and 0.45 VAC at approximately 18.1 KHz were found to yield good results.

If desired, a second electroplating solution may be employed to adjust the stoichiometry of the electrodeposited film prior to the vapor deposition phase. For example, a first electrodeposition step may produce a CIGS precursor film with less gallium than optimally desired. Although the gallium content can be increased during the vapor deposition phase, it may be less expensive to deposit a certain amount of gallium using a second electrodeposition solution to make a coarse stoichiometric adjustment prior to proceeding to fine stoichiometric adjustment at the vapor deposition step. Another potential motivation for using a second electrodeposition solution is to achieve a composition gradient in the deposited film, as suggested by U.S. Pat. No. 4,335,266 issued to Mickelsen et al. which is hereby incorporated by reference for its teachings of composition-graded CIGS thin films for solar cell and other applications. Yet another way of achieving composition grading during electrodeposition is to vary process parameters such as cathodic potential, ionic concentrations, pH, or temperature, as electrodeposition proceeds.

Several examples of electrodeposited photovoltaic precursor films fabricated according to the present invention are given. These examples include In—Se, Cu—Se, and Cu—In—Se precursor films. For these precursor films, Ga should be added to raise the energy gap. The Ga may be added by a separate electrodeposition step, though is preferably added at the vapor deposition step by vaporizing elemental gallium. An example is also given of a novel solution and process that allows Ga to be electrodeposited along with other precursor constituents, to produce a Cu—In—Ga—Se precursor film electrodeposited in a single step. The solution includes ions of each of the elements of copper, indium, gallium, and selenium. These ions may be supplied in the form of dissolved metal salts.

After the precursor film 18 has been electrodeposited it should be cleaned. A suitable method is to rinse precursor film 18 with deionized water and dry it in flowing nitrogen gas. After precursor film 18 has been cleaned, an additional layer 20 of In+Se or Cu+Se, either alone or in combination with gallium, is deposited by physical vapor deposition to adjust the final film composition to the ratios of approximately Cu=1–1.2:(In,Ga)=1–1.2:Se=2–2.5, and most preferably to approximately 1:1:2. By controlling the ratio of In/Ga the energy gap between the CdS and the CIGS layers can be adjusted to the optimal or nearly optimal value. An energy gap of approximately 1.45 eV is considered optimal for terrestrial solar energy conversion, and is achieved by an In/Ga ratio of approximately 3:1. The substrate (precursor film) temperature should be 300° C. to 600° C. during PVD, and preferably about 550° C.

After PVD, the films should then be annealed. Annealing improves the homogeneity and quality of the films. A high quality CIGS film is one that does not exhibit an excessive amount of copper nodules, voids, or vacancies in the film which would reduce conversion efficiencies. Annealing the films at 250° C. to 500° C. in a vacuum, followed by slow cooling at a rate of approximately 3° C./min to avoid thermal shock was found to yield good results. Because selenium has a much higher vapor pressure than either copper, indium, or gallium, selenium may be lost from the film during the high temperature steps of vapor deposition and annealing. To compensate, the atmosphere during these steps may contain a moderate overpressure of selenium. In the preferred embodiment, the film is selenized at a rate of 5–100 Å/s during cool-down from PVD temperature to annealing temperature.

Once the CIGS layers 18 and 20 collectively are deposited and annealed, a thin layer 22 of n-type semiconductor comprising cadmium sulfide is deposited next. CdS layer 22 is preferably deposited by chemical bath deposition (CBD) to a thickness of approximately 200–1000 Å. The CBD bath may be prepared from 0.08 gm $CdSO_4$, 2.5 gm thiourea, and 27.5 gm $NH_4OH$ dissolved in 200 ml water. The deposition temperature should be approximately 40°–80° C.

Figure 2:
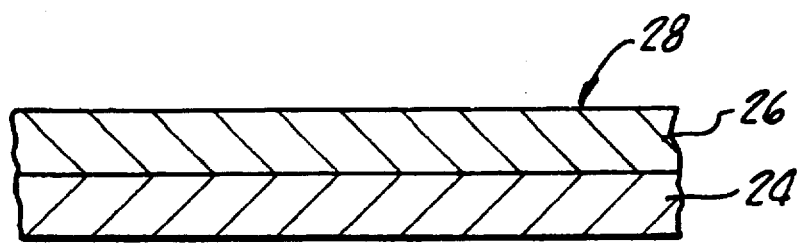
FIG. 2 is a cross sectional view of the conducting zinc oxide layer 28 shown in FIG. 1.

A layer 28 of conducting wide bandgap n-type semiconductor materials is deposited next. In the preferred embodiment, layer 28 comprises two zinc oxide layers 24 and 26 as shown in FIG. 2. First zinc oxide layer 24 is deposited with RF sputtering at approximately 0.62 watts/$cm^2$ in an argon plasma at 10 millitorrs pressure. Second zinc oxide layer 26, comprising approximately 1–5% $Al_2O_3$-doped zinc oxide, is also prepared using RF sputtering at approximately 1.45 watts/$cm^2$ in an argon plasma at 10 millitorrs pressure. In an exemplary embodiment the resistivity of the first layer was 50–200 ohm/$cm^2$, and resistivity of the second layer was 15–20 ohm/$cm^2$. The transmissivity of the overall ZnO layer was 80–85%.

Bi-layer metal contacts 30 may then be prepared with an e-beam system or other techniques. In an exemplary embodiment a first metal contact layer was 500–1000 Å thick Ni and the second metal contact layer was 1–3 μm thick Al. Metal contacts 30 will generally be laid out in fine grid lines across the collecting surface of the device and connected to a suitable current collecting electrode (not shown). The efficiency of the resulting device can be further increased by adding an antireflection coating 32, such as a 600–1000 Å layer of $MgF_2$ by electron beam. A device prepared according to Example 3 below exhibited a conversion efficiency of 9.44%.

EXAMPLE 1

A photovoltaic precursor film of $In_{1-2}Se_{1-3}$ was electrodeposited on glass substrates coated with a Mo or Mo/Cu layer approximately 500 Å thick. The precursor film was deposited using an electroplating solution containing 2.25 gm $InCl_3$ and 0.41 gm $H_2SeO_3$ dissolved in 200 ml of water. The pH of the solution was adjusted between 1.4 and 2.4 using dilute HCl (10% by with an alternating current voltage of 0.45 V at 18.1 KHz frequency. The films were 1–3 μm thick and adhered to the substrate.

EXAMPLE 2

A photovoltaic precursor film of $Cu_{1-2}Se_{1-3}$ was electrodeposited on a substrate using an electroplating solution containing 6.21 gm $Cu(NO_3)_2.6H_2O$ and 1.16 gm $H_2SeO_3$ dissolved in 300 ml water. The pH was adjusted between 1.4 and 2.4 using dilute HCl (10% by volume). The films were deposited by applying a 2–5 V direct current voltage in combination with an alternating current voltage of 0.45 V at 18.1 KHz frequency. As deposited layers were 1–3 μm thick and adhered to the substrate.

EXAMPLE 3

A photovoltaic precursor film of $Cu_{1-2}In_{1-2}Se_{1-3}$ was electrodeposited on a substrate using an electroplating solution containing 4.47 gm $CuCl_2$, 5.67 gm $InCl_3$ and 3.39 gm $H_2SeSO_3$ dissolved in 1050 ml water. The pH was adjusted between 1.4 and 2.4 using dilute HCl (10% by volume). The films were deposited by applying a 2–5 V direct current voltage in combination with an alternating current voltage of 0.45 V at 18.1 KHz frequency. As deposited layers were 1–3 μm thick and adhered to the substrate. The electrodeposited film was slightly indium poor. Indium was then added by vapor deposition to adjust the final content to approximately $CuInSe_2$. CdS and ZnO were then added to complete the solar cell. The resulting solar cell was exposed to ASTM E892-87 Global (1000 $Wm^{-2}$) standard irradiance spectrum at 25° C. Performance parameters for the finished solar cell, having an area of 0.4285 $cm^2$, were measured as:

| | |
|---|---|
| $V_{oc}$ = 0.4138 V | $V_{Pmax}$ = 0.3121 V |
| $I_{sc}$ = 15.40 mA | $I_{Pmax}$ = 12.96 mA |
| $J_{sc}$ = 35.94 mA $cm^{-2}$ | $P_{max}$ = 4.045 mW |
| Fill Factor = 63.47% | Efficiency = 9.44% |

Figure 3:
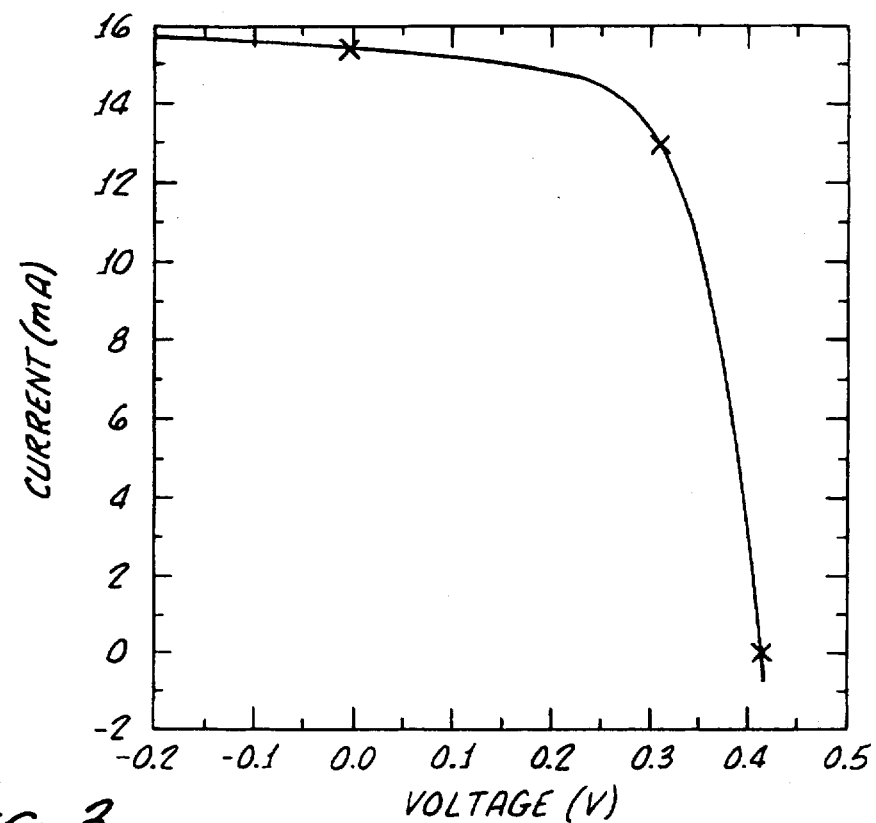
FIG. 3 is the current vs. voltage performance plot of a $CdS/CuInSe_2$ solar cell prepared according to Example 3 of the present invention.
Figure 4:
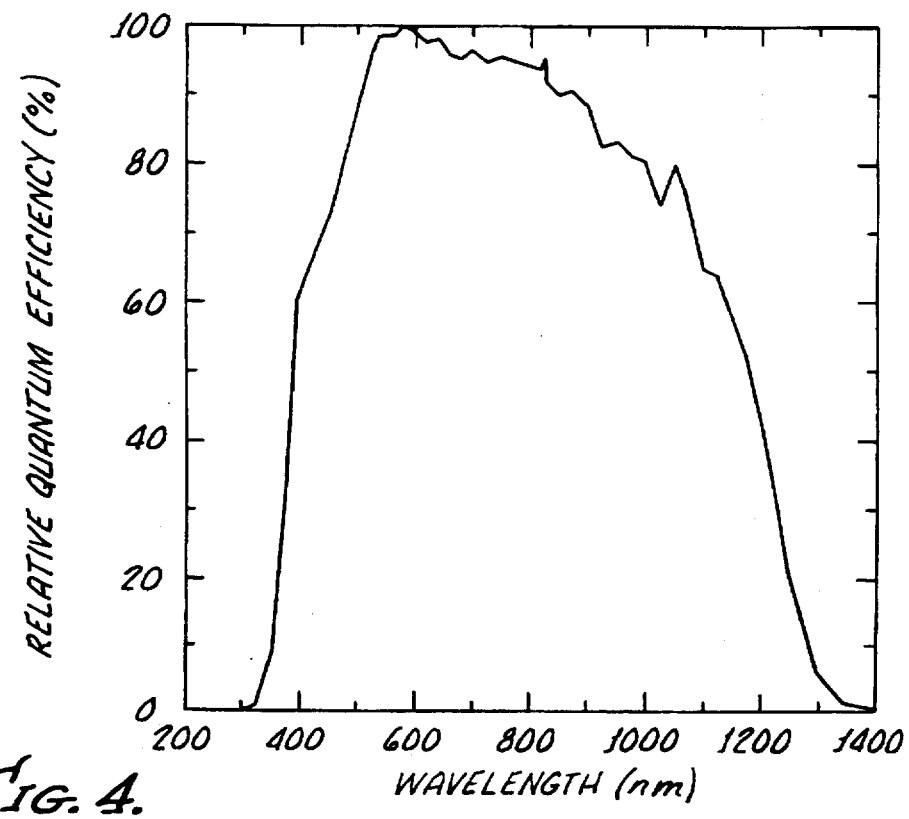
FIG. 4 is a plot of relative quantum efficiency versus wavelength for the $CdS/CuInSe_2$ solar cell of Example 3.

FIG. 3 is an I-V plot for the device. FIG. 4 is a plot of the relative quantum efficiency of the device. The device contained only Cu—In—Se, without any gallium. The device exhibited an efficiency of 8.76% without antireflective coating, and 9.44% after an antireflective coating was added. It is believed that by adding gallium the efficiency of the resulting cell could be improved to around fourteen percent (14%).

EXAMPLE 4

A photovoltaic precursor film of $Cu_{1-2}In_{1-2}Ga_{0.01-1}Se_{1-3}$ was electrodeposited using a solution containing 1.12 gm $Cu(NO_3)_2.6H_2O$, 12.0 gm $InCl_3$, 4.60 gm $Ga(NO_3)_3.xH_2O$ and 1.80 gm $H_2SeO_3$ dissolved in 450 ml of water. This is equivalent to approximately 2.49 gm/l $Cu(NO_3)_2.6H_2O$, 26.7 gm/l $InCl_3$, 10.2 gm/l $Ga(NO_3)_3.xH_2O$ and 4.0 gm/l $H_2SeO_3$, and approximately 0.0084, 0.12, 0.28, and 0.31 molar of copper, indium, gallium, and selenium ions, respectively. The pH was adjusted between 1.4 and 2.4 using dilute HCl (10% by volume). The films were deposited by applying a 2–5 V direct current voltage in combination with an alternating current voltage of 0.45 V at 18.1 KHz frequency. As deposited layers were 1–3 μm thick and adhered to the substrate.

EXAMPLE 5

A photovoltaic precursor film of $Cu_{1-2}In_{1-2}Ga_{0.01-1}Se_{1-3}$ was electrodeposited using a solution containing 1.496 gm $Cu(No_3).5H_2O$, 14.929 gm $InCl_3$, 1.523 gm $H_2SeO_3$, and 7.192 gm $Ga(NO_3)_3$ dissolved in 450 ml of DMSO. The films were deposited at 25° C. and also at 50° C. at an applied voltage of 5 VDC.

EXAMPLE 6

A photovoltaic precursor film of $Cu_{1-2}In_{1-2}Ga_{0.01-1}Se_{1-3}$ electrodeposited using a solution containing 1.496 gm $Cu(NO_3)_2 \cdot 5H_2O$, 14.929 gm $InCl_3$, 1.523 gm $H_2SeO_3$, and 7.192 gm $Ga(NO_3)_3$ dissolved in a mixture of 400 ml DMSO and 50 ml water. The films were deposited at 25° C. and also at 50° C. at an applied voltage of 5 VDC.

EXAMPLE 7

A photovoltaic precursor film of $Cu_{1-2}In_{1-2}Ga_{0.01-1}Se_{1-3}$ was electrodeposited using a solution containing 1.496 gm $Cu(NO_3)_2 \cdot 5H_2O$, 14.929 gm $InCl_3$, 1.523 gm $H_2SeO_3$, 7.192 gm $Ga(NO_3)_3$, and 10 gm $Na_2SO_4$, and 20 gm LiCl dissolved in a mixture of 400 ml DMSO and 50 ml water. The films were deposited at 25° C. and also at 50° C. at an applied voltage of 5 VDC.

The present invention as described above may be incorporated in a variety of applications, as for example the conversion of solar energy to electric energy for baseline power generation. Other applications include appliances such as solar-powered calculators, battery charges such as those used with freeway emergency call boxes, photoelectric eyes, night security light activators, light meters for photographic and other purposes, and the like.

Although the present invention has thus been described in detail with regard to the preferred embodiments and drawings and examples thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

What is claimed is:

1. A process for preparing a metal-containing thin film, the process comprising the steps of:

electrodepositing a layer of $Cu_xIn_yGa_zSe_n$ (x=0–2, y=0–2, z=0–2, n=0–3) on a substrate, the electrodeposition proceeding at a DC voltage of approximately 1–10 V and an AC voltage of approximately 0.2–5.0 V at 1–100 KHz superimposed upon said DC voltage; and depositing a sufficient amount of either In+Se or Cu+Se on said layer of $Cu_xIn_yGa_zSe_n$ by vapor deposition to produce a thin film of $Cu(In,Ga)Se_2$ on the substrate wherein said thin film has stoichiometric ratios of approximately Cu=1–1.2:(In,Ga)=1–1.2:Se=2–2.5.

2. The process of claim 1 wherein said layer of $Cu_xIn_yGa_zSe_n$ (x=0–2, y=0–2, z=0–2, n=0–3) comprises $In_{1-2}Se_{1-3}$.

3. The process of claim 1 wherein said layer of $Cu_xIn_yGa_zSe_n$ (x=0–2, y=0–2, z=0–2, n=0–3) comprises $Cu_{1-2}Se_{1-3}$.

4. The process of claim 1 wherein said layer of $Cu_xIn_yGa_zSe_n$ (x=0–2, y=0–2, z=0–2, n=0–3) comprises $Cu_{1-2}In_{1-2}Se_{1-3}$.

5. The process of claim 1 wherein said layer of $Cu_xIn_yGa_zSe_n$ (x=0–2, y=0–2, z=0–2, n=0–3) comprises $Cu_{1-2}In_{1-2}Ga_{0.01-1}Se_{1-3}$ (x=1–2, y=1–2, z=0.01–1, n=1–3).

6. The process of claim 1 wherein the vapor deposition comprises physical vapor deposition.

7. The process of claim 6 wherein the physical vapor deposition proceeds at a temperature of approximately 550° C.

8. The process of claim 1 wherein the electrodeposition proceeds in an aqueous electrodeposition solution, said DC voltage is approximately 1–5 volts, and said AC voltage is approximately 0.3–1.0 volts at approximately 10–30 KHz.

9. The process of claim 8 wherein said DC voltage is approximately 2 volts and said AC voltage is approximately 0.45 volts at approximately 18.1 KHz.

10. The process of claim 1 wherein said DC voltage is approximately 3–10 volts, and the electrodeposition proceeds in an electrodeposition solution comprising at least one organic solvent, and the electrodeposition further proceeds at an AC voltage of approximately 0.2–5.0 volts at approximately 1–100 KHz superimposed upon said DC voltage.

11. The process of claim 10 wherein said AC voltage is approximately 0.45 volts at approximately 18.1 KHz.

12. The process of claim 1 wherein the electrodeposition step proceeds in an electrodeposition solution comprising at least one supporting electrolyte for raising the conductivity of the electrodeposition solution and increasing the deposition rate of the $Cu_xIn_yGa_zSe_n$ layer.

13. The process of claim 12 wherein said supporting electrolyte comprises at least one compound selected from the group consisting of NaCl, LiCl, and $Na_2SO_4$.

14. The process of claim 1 further comprising the steps of:

depositing a CdS layer on the $Cu_xIn_yGa_zSe_n$ film by chemical bath deposition; and depositing a ZnO layer on the CdS layer by RF sputtering.

15. A process for preparing a solar cell precursor thin film, the process comprising the steps of:

(a) providing an electrodeposition solution containing copper, indium, gallium, and selenium ions;

(b) immersing a substrate into said electrodeposition solution; and (c) electroplating said copper, indium, gallium, and selenium ions simultaneously onto said substrate by applying a cathodic potential thereto of 1–10 VDC voltage and 0.2–5.0 VAC at 1–100 KHZ superimposed thereon.

16. The process according to claim 15, wherein said electrodeposition solution includes at least one organic solvent.

17. The process according to claim 16, wherein said cathodic potential is approximately 2 VDC and approximately 0.45 VAC at 10–30 KHz superimposed thereon.

18. The process according to claim 15, wherein said cathodic potential is approximately 1–5 VDC and 0.3–1.0 VAC at 10–30 KHz superimposed thereon.

19. The process according to claim 18, wherein said electrodeposition solution comprises approximately 2.49 gm/l $Cu(NO_3)_2 \cdot 6H_2O$, 26.7 gm/l $InCl_3$, 10.2 gm/l $Ga(NO_3)_3$, and 4.0 gm/l $H_2SeO_3$).

20. The process according to claim 19, wherein said electrodeposition solution includes at least one organic solvent.

* * * * *